US012022680B2

(12) United States Patent
Hanamoto

(10) Patent No.: US 12,022,680 B2
(45) Date of Patent: Jun. 25, 2024

(54) DISPLAY DEVICE

(71) Applicant: SHARP KABUSHIKI KAISHA, Sakai (JP)

(72) Inventor: Tetsuya Hanamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 406 days.

(21) Appl. No.: 17/440,756

(22) PCT Filed: Apr. 5, 2019

(86) PCT No.: PCT/JP2019/015223
§ 371 (c)(1),
(2) Date: Sep. 17, 2021

(87) PCT Pub. No.: WO2020/202576
PCT Pub. Date: Oct. 8, 2020

(65) Prior Publication Data
US 2022/0190287 A1    Jun. 16, 2022

(51) Int. Cl.
*H10K 50/844* (2023.01)
*H10K 59/122* (2023.01)
*H10K 71/00* (2023.01)

(52) U.S. Cl.
CPC ......... *H10K 50/844* (2023.02); *H10K 59/122* (2023.02); *H10K 71/00* (2023.02)

(58) Field of Classification Search
CPC ..... H10K 50/844; H10K 59/122; H10K 71/00
See application file for complete search history.

(56) References Cited

U.S. PATENT DOCUMENTS

| 10,897,026 | B2 * | 1/2021 | Abe | H10K 59/124 |
| 2010/0151211 | A1 | 6/2010 | Kodaira et al. | |
| 2017/0031323 | A1 * | 2/2017 | Kim | H10K 59/1213 |
| 2018/0151834 | A1 * | 5/2018 | Kanaya | H10K 50/8426 |
| 2018/0183015 | A1 * | 6/2018 | Yun | H10K 71/80 |
| 2020/0235194 | A1 | 7/2020 | Ito et al. | |
| 2020/0287157 | A1 * | 9/2020 | Seong | H10K 59/12 |
| 2020/0313102 | A1 * | 10/2020 | Kim | H10K 59/124 |
| 2021/0343981 | A1 * | 11/2021 | Xie | H10K 71/00 |
| 2021/0359035 | A1 * | 11/2021 | Wang | H10K 59/122 |

FOREIGN PATENT DOCUMENTS

| CN | 107452894 A | 12/2017 |
| JP | 2010-141181 A | 6/2010 |
| WO | 2019/073678 A1 | 4/2019 |

* cited by examiner

*Primary Examiner* — Shaun M Campbell
(74) *Attorney, Agent, or Firm* — ScienBiziP, P.C.

(57) ABSTRACT

A display device includes a hole portion provided in a non-display region. A first opening that surrounds the hole portion is formed in at least one inorganic insulating film in a plurality of inorganic insulating films of the non-display region. A sealing inorganic insulating film includes an edge sealing portion in a frame shape, the edge sealing portion being formed so as to cover an edge of the at least one inorganic insulating film around the hole portion. A reverse-tapered bank structure portion in a frame shape and a protruding portion including an inorganic film in a frame shape are formed to surround the first opening on the at least one inorganic insulating film. Both side surfaces of the reverse-tapered bank structure portion are tilted in a reverse tapered shape whose width between both the side surfaces gradually decreases toward a side of a resin substrate.

14 Claims, 7 Drawing Sheets

DISPLAY DEVICE

TECHNICAL FIELD

The disclosure relates to a display device.

BACKGROUND ART

In manufacture of a display device including an EL element, a layered body formed on the mother base material and composed of a TFT layer, a light-emitting element layer, a sealing layer and the like is divided to obtain a plurality of display devices (individual pieces).

CITATION LIST

Patent Literature

PTL 1: JP 2010-141181 A (published on Jun. 24, 2010)

SUMMARY

Technical Problem

When a hole (hole portion) for a camera and the like is provided in a display region of a display device including an OLED element, if a thin film encapsulation (TFE) inorganic film is present at a portion for processing of the hole portion, a crack occurred in the TFE inorganic film may propagate to a base coat layer and reach the display region.

An object of an aspect of the disclosure is to provide a display device that can prevent advancement of the crack that occurs when processing a hole portion in a display region.

Solution to Problem

A display device of an aspect of the disclosure is a display device including: a resin substrate; a thin film transistor layer including a plurality of inorganic insulating films; a light-emitting element; and a sealing layer including a sealing inorganic insulating film, the resin substrate, the thin film transistor layer, the light-emitting element, and the sealing layer being layered in this order. The light-emitting element includes a first electrode, a second electrode, and a function layer disposed between the first electrode and the second electrode, the display device includes a display region, a frame region that surrounds the display region, and a non-display region provided in the display region in an island form, the display device includes a hole portion provided in the non-display region, a first opening that surrounds the hole portion is formed in at least one inorganic insulating film in the plurality of inorganic insulating films of the non-display region, the sealing inorganic insulating film includes an edge sealing portion in a frame shape, the edge sealing portion being formed so as to cover an edge of the at least one inorganic insulating film around the hole portion, a reverse-tapered bank structure portion in a frame shape and a protruding portion including an inorganic film in a frame shape are formed to surround the first opening on the at least one inorganic insulating film, and both side surfaces of the reverse-tapered bank structure portion are tilted in a reverse tapered shape whose width between both the side surfaces gradually decreases toward a side of the resin substrate.

Advantageous Effects of Disclosure

According to an aspect of the disclosure, it is possible to prevent advancement of the crack that occurs when processing a hole portion in a display region.

DESCRIPTION OF EMBODIMENTS

In the following description, the "same layer" means that it is formed through the same process (film formation step), the "lower layer" means that it is formed through a process before that of the compared layer, and the "upper layer" means that it is formed through a process after that of the compared layer.

Figure 1:
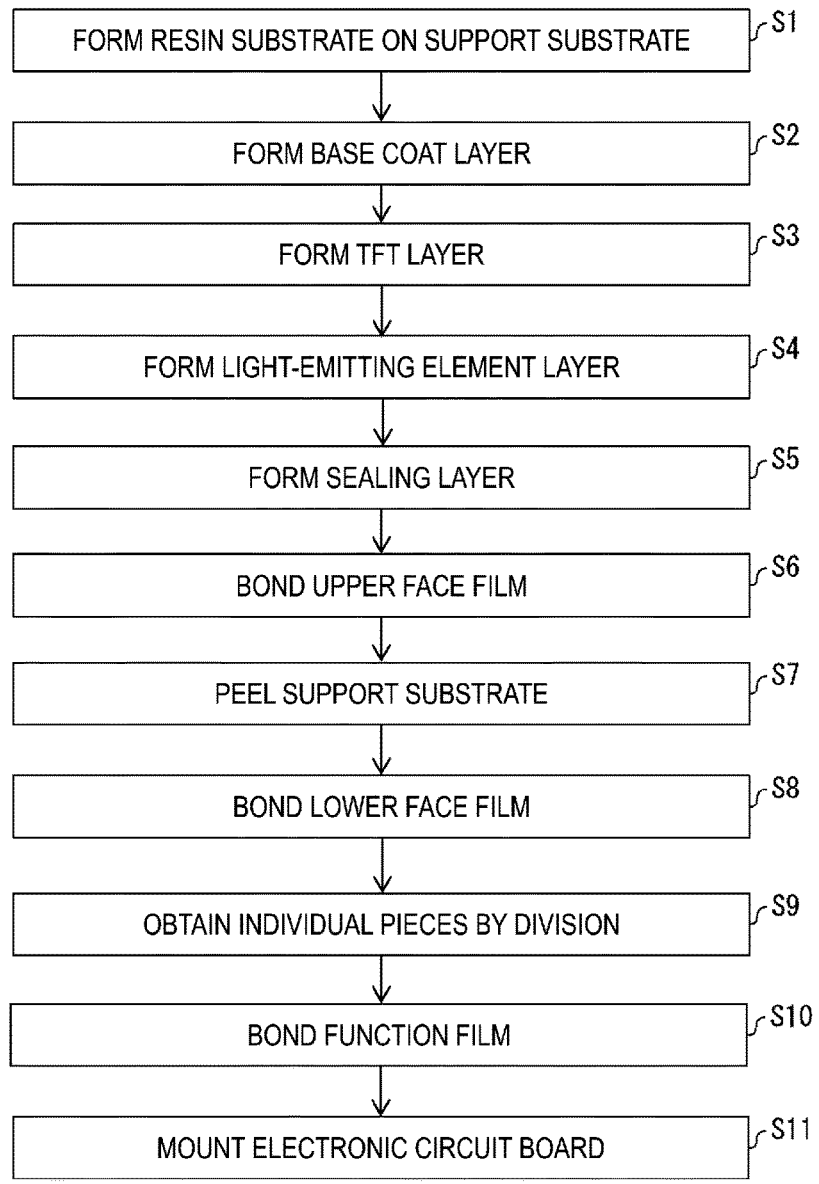
FIG. 1 is a flowchart of an example of a manufacturing method of a display device according to a first embodiment.
Figure 2:
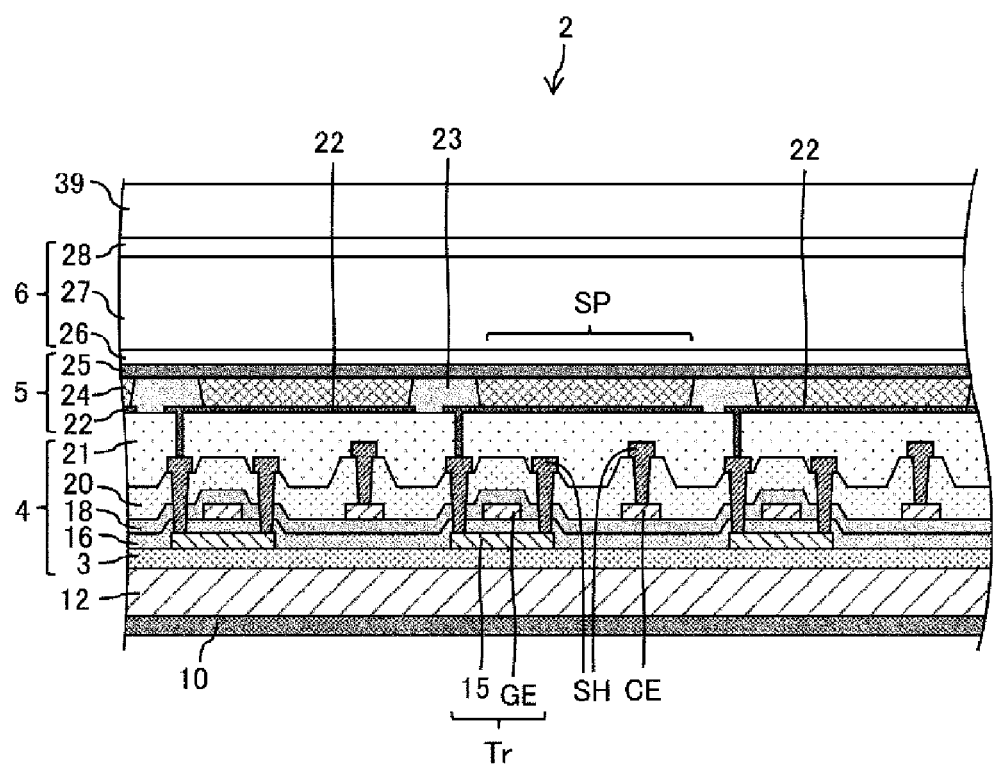
FIG. 2 is a cross-sectional view illustrating a configuration example of a display portion of the display device.
Figure 3:
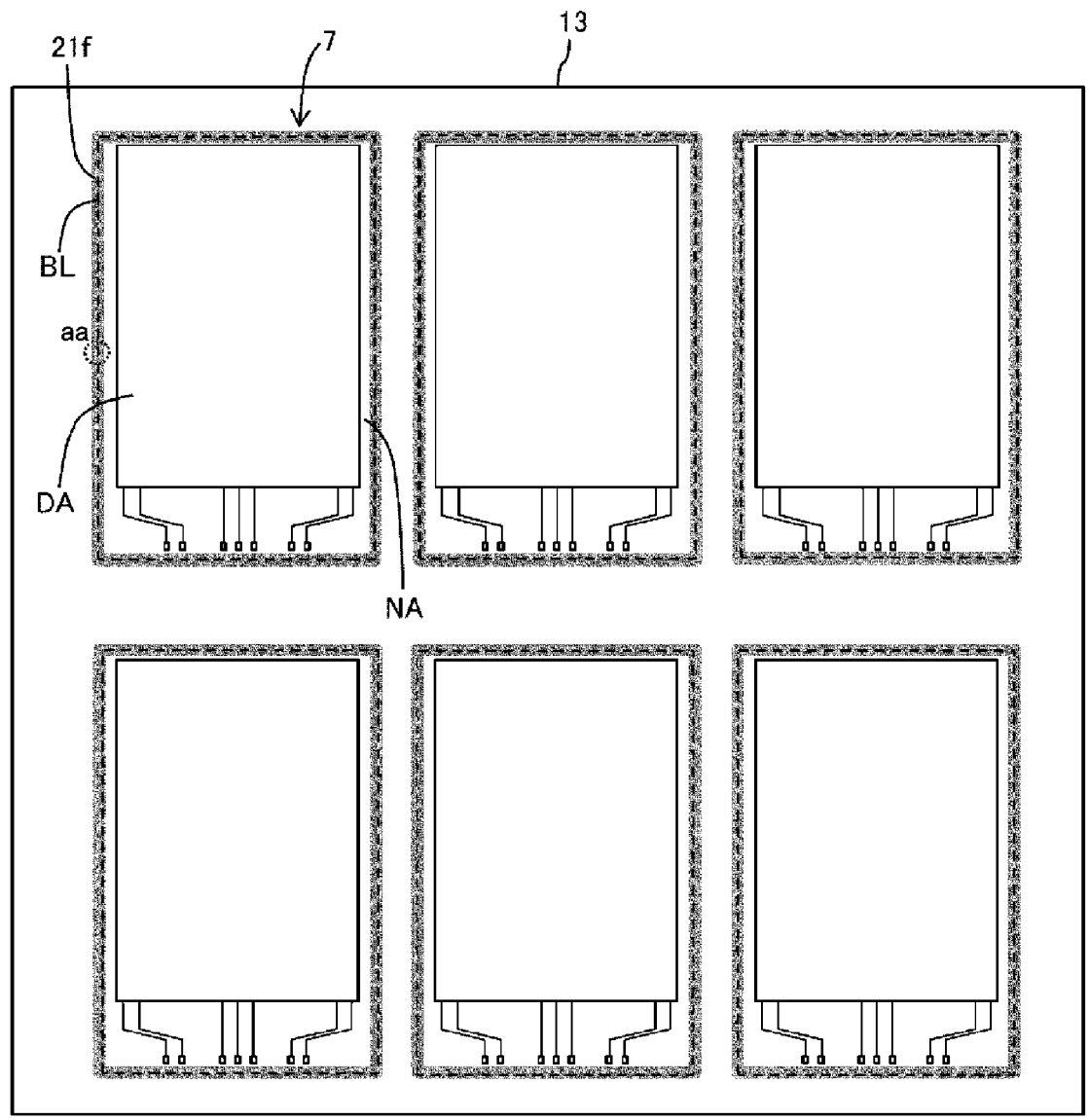
FIG. 3 is a plan view illustrating a manufacturing method of the display device.

FIG. 1 is a flowchart of an example of a manufacturing method of a display device 2. FIG. 2 is a cross-sectional view illustrating a configuration example of a display portion of the display device 2. FIG. 3 is a plan view illustrating a manufacturing method of the display device 2.

When manufacturing the display device 2 having flexibility, as illustrated in FIG. 1 to FIG. 3, first, a resin substrate 12 is formed on a support substrate 13 with transparency (e.g., a mother glass) (step S1).

Next, a base coat layer 3 is formed (step S2). Next, a thin film transistor layer (TFT layer) 4 is formed (step S3). Next, a top-emission light-emitting element layer (e.g., an OLED element layer) 5 is formed (step S4). Next, a sealing layer 6 is formed (step S5). Next, an upper face film is bonded on the sealing layer 6 (step S6).

Next, the support substrate 13 is peeled off from the resin substrate 12 by reducing the coupling force between the support substrate 13 and the resin substrate 12 by applying laser light to the lower face of the resin substrate 12 through the support substrate 13 (step S7). Next, a lower face film 10 is bonded to the lower face of the resin substrate 12 (step S8). Next, a layered body 7 including the lower face film 10, the resin substrate 12, the thin film transistor layer 4, the light-emitting element layer 5 and the sealing layer 6 is divided by a cutting line BL (see FIG. 3) to obtain a plurality of individual pieces (step S9). Next, a function film 39 is bonded to the obtained individual pieces (step S10). Next, an electronic circuit board (e.g., IC chip) is mounted to a terminal for external connection (step S11).

Examples of the material of the resin substrate 12 include polyimide, and examples of the material of the lower face film 10 include polyethylene terephthalate (PET).

The thin film transistor layer 4 includes the base coat layer 3, a first interlayer insulating film 16 (inorganic insulating film) as the upper layer of the base coat layer 3, a semiconductor layer 15, the first interlayer insulating film (inorganic insulating film) 16 as the upper layer of the semiconductor layer 15, a first metal layer as a gate electrode GE as the upper layer of the first interlayer insulating film (inorganic insulating film) 16, a second interlayer insulating film 18 (inorganic insulating film) as the upper layer of the first metal layer, a second metal layer as a capacitance wiring line CE as the upper layer of the second interlayer insulating film 18, a third interlayer insulating film 20 (inorganic insulating film) as the upper layer of the second metal layer, a third metal layer as a source wiring line SH as the upper layer of the third interlayer insulating film 20, and a flattening film 21 as the upper layer of the third metal layer.

In a frame region NA of the thin film transistor layer 4, a terminal used for connection with electronic circuit boards such as IC chips and FPCs, and a terminal wiring line that connects the terminal and a wiring line of a display region DA and the like are formed. The terminal and terminal wiring line are composed of the first metal layer, the second metal layer and the third metal layer.

The base coat layer 3 is a layer that prevents foreign matters such as water and oxygen from reaching the thin film transistor layer 4 and the light-emitting element layer 5, and may be composed of a silicon oxide film, a silicon nitride film, a silicon oxynitride film, or a layered film of these formed by CVD, for example.

The semiconductor layer 15 is composed of a low temperature polysilicon (LTPS) or an oxide semiconductor, for example. In FIG. 2, a TFT with the semiconductor layer 15 as a channel is illustrated in a top-gate structure, but it may have a bottom-gate structure (e.g., in the case where the channel of the TFT is an oxide semiconductor). Note that a thin layer transistor Tr (TFT) is configured to include the semiconductor layer 15, the first interlayer insulating film 16, and the gate electrode GE.

The first metal layer, the second metal layer, and the third metal layer are composed of a single layer film or a layered film of metal including at least one of aluminum (Al), tungsten (W), molybdenum (Mo), tantalum (Ta), chromium (Cr), titanium (Ti), and copper (Cu), for example.

The first interlayer insulating film 16, the second interlayer insulating film 18, and the third interlayer insulating film 20 are composed of a silicon oxide (SiOx) film, a silicon nitride (SiNx) film or a layered film of these formed by CVD, for example.

The flattening film 21 may be composed of applicable organic materials such as polyimide and acrylic.

The light-emitting element layer 5 (e.g., an organic light-emitting diode layer) includes a first electrode 22 as an anode as the upper layer of the flattening film 21, an insulating edge cover 23 that covers an edge of the first electrode 22, a function layer 24 as an electroluminescence (EL) layer as the upper layer of the first electrode 22, and a second electrode 25 as a cathode as the upper layer of the function layer 24, and a light-emitting element (e.g., an organic light-emitting diode (OLED)) including the first electrode 22, the function layer 24, and the second electrode 25 in an island form and a sub-pixel circuit that drives it are provided for each subpixel. The edge cover 23 may be composed of an applicable photosensitive organic material such as polyimide and acrylic, for example.

The function layer 24 is formed by stacking, in the order from the lower layer side, a hole injection layer, a hole transport layer, a light-emitting layer, an electron transport layer, and an electron injection layer, for example. The light-emitting layer is formed in an island form for each subpixel by vapor deposition or an ink-jet method. Other layers are formed in an island form or a solid form (common layer). In addition, it is also possible to adopt a configuration in which one or more of the hole injection layer, hole transport layer, electron transport layer, and electron injection layer are not formed.

The first electrode 22 is composed of layering of an indium tin oxide (ITO) and Ag (silver) or an alloy including Ag, and has light reflectivity, for example. The second electrode 25 may be composed of a transparent conductive material such as an MgAg alloy (extra-thin film), an indium tin oxide (ITO) and an indium zinc oxide (IZO).

In the case where the light-emitting element layer 5 is an OLED layer, a driving current between the first electrode 22 and the second electrode 25 causes holes and electrons to recombine in the function layer 24, and the resulting excitons fall to the ground state, thus emitting light. The second electrode 25 has transparency, and the first electrode 22 has light reflectivity, thus light emitted from the function layer 24 travels upward, serving as top-emission.

The light-emitting element layer 5 is not limited to the configuration in which it constitutes an OLED element, and may constitute an inorganic light-emitting diode or a quantum dot light-emitting diode.

The sealing layer 6 is transparent, and includes a first sealing inorganic insulating film 26 that covers the second electrode 25, an organic film 27 as the upper layer of the first sealing inorganic insulating film 26, and a second sealing inorganic insulating film 28 as the upper layer of the organic film 27. The sealing layer 6 that covers the light-emitting element layer 5 prevents penetration of foreign matters such as water and oxygen into the light-emitting element layer 5.

Each of the first sealing inorganic insulating film 26 and the second sealing inorganic insulating film 28 may be composed of a silicon oxide film, a silicon nitride film, a silicon oxynitride film, or a layered film of these formed by CVD, for example. The organic film 27 is a transparent organic film having a flattening effect, and may be composed of an applicable organic material such as acrylic.

The lower face film 10 is configured to be bonded to the lower face of the resin substrate 12 after a support substrate is peeled off for the purpose of achieving a display device with excellent flexibility, and examples of the material of the lower face film 10 include PET. The function film 39 has an optical compensation function, a touch sensor function, a protection function and the like, for example.

The case where flexible the display device 2 is manufactured is described above, but in the case where a non-flexible display device 2 is manufactured, reattachment of the substrate and the like are unnecessary, and therefore, step S5 proceeds to step S9 in FIG. 1, for example.

First Embodiment

Figure 4:
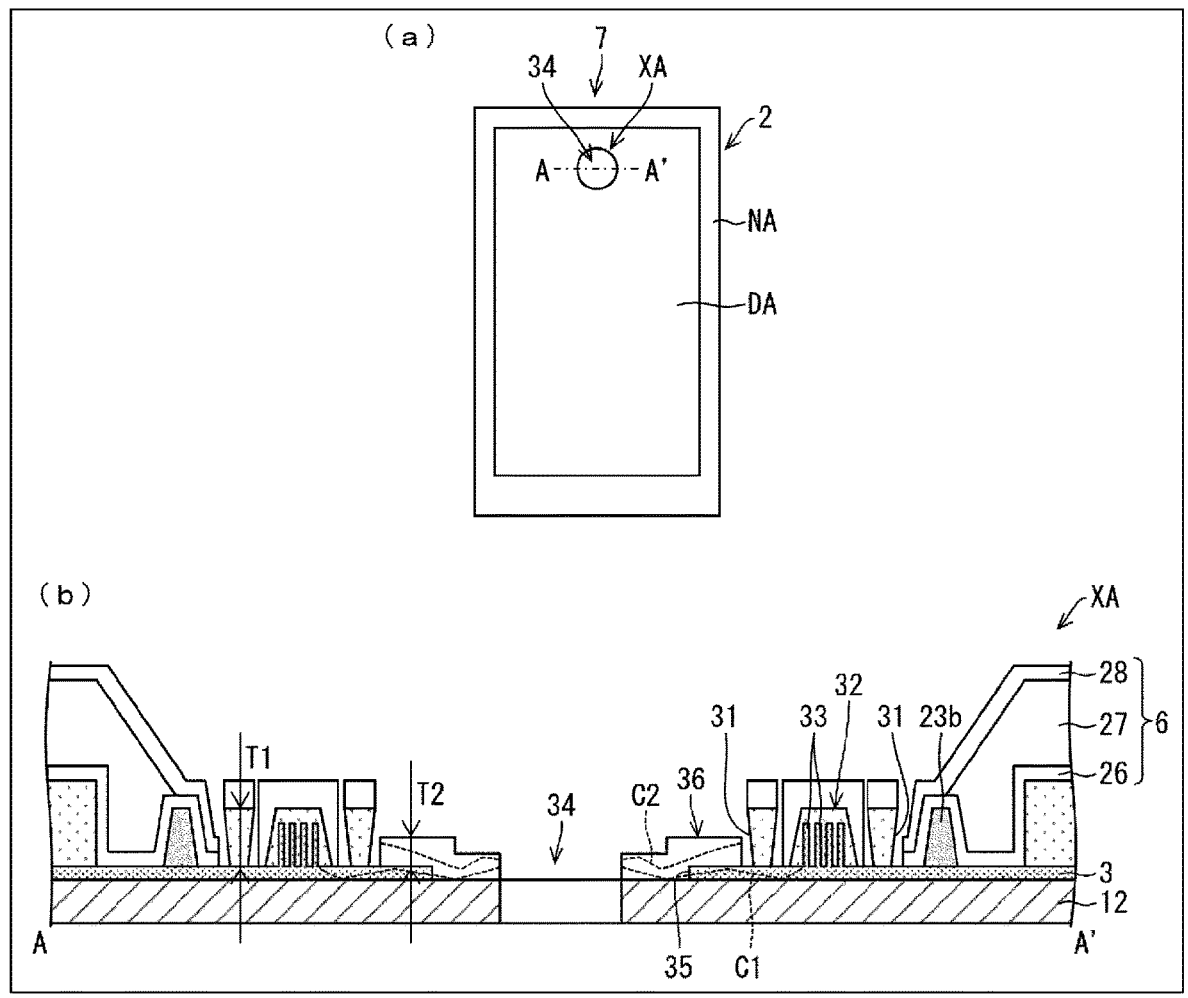
FIG. 4(a) is a plan view illustrating a non-display region of the display device.
FIG. 4(b) is a cross-sectional view along a plane AA' illustrated in FIG. 4(a).
Figure 5:
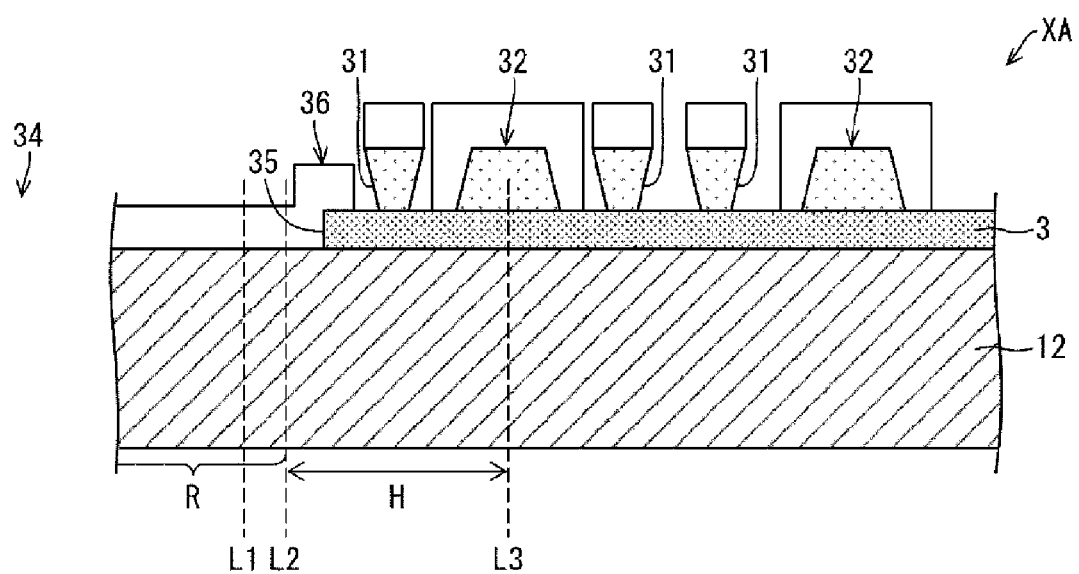
FIG. 5 is an enlarged cross-sectional view for describing a reverse-tapered bank structure portion and a protruding portion of the non-display region of the display device.
Figure 6:
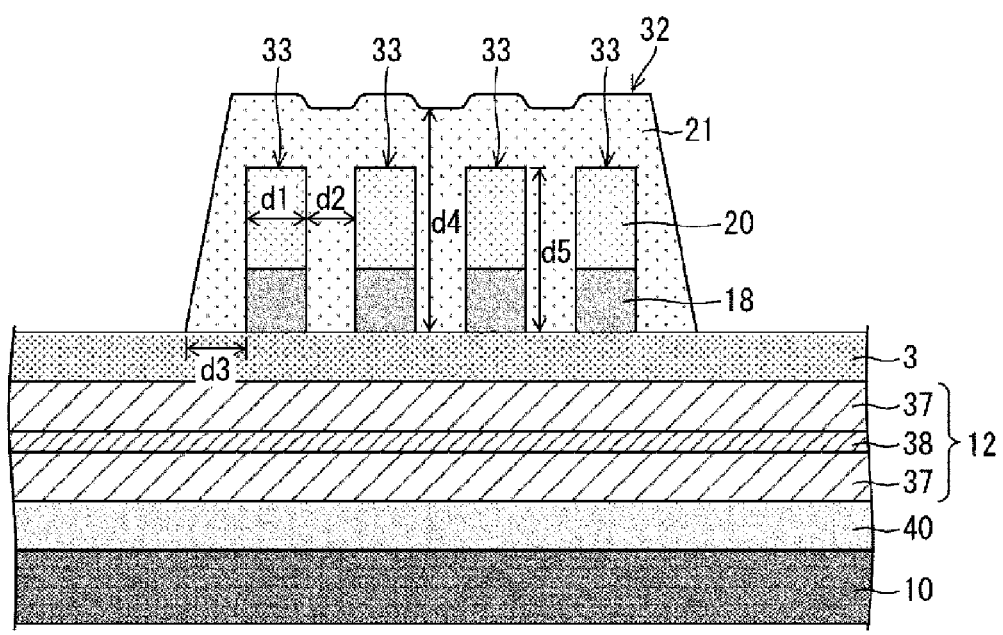
FIG. 6 is an enlarged cross-sectional view of the protruding portion.

FIG. 4(a) is a plan view illustrating a non-display region XA of the display device 2, and FIG. 4(b) is a cross-sectional view taken along a plane AA' illustrated in FIG. 4(a). FIG. 5 is an enlarged cross-sectional view for describing a reverse-tapered bank structure portion 31 and a protruding portion 32 in the non-display region XA of the display device 2. FIG. 6 is an enlarged cross-sectional view of the protruding portion 32. The same constituent elements as the above-described constituent elements are denoted with the same reference numerals, and detailed descriptions of such constituent elements are not repeated.

As illustrated in FIG. 4(a), the non-display region XA is provided in an island form in the display region DA. A hole portion 34 is provided in the non-display region XA as illustrated in FIG. 4(b). For a camera and the like disposed in the display region DA, a hole that extends through the resin substrate 12, the first sealing inorganic insulating film 26, and the second sealing inorganic insulating film 28 is formed in the hole portion 34 by cutting with a laser.

In the base coat layer 3 in the non-display region XA, an opening 35 (a first opening and a second opening) that surrounds the hole portion 34 is formed. Preferably, an opening 35 (the first opening and the second opening) is formed so as to surround the hole portion 34 and expose a part of the resin substrate 12, but it may be formed so as to surround the hole portion 34 and cover all of the resin substrate 12.

An edge sealing portion 36 in a frame shape is formed so as to cover the edge of the opening 35 of the base coat layer 3 at the periphery of the hole portion 34. The edge sealing portion 36 is composed of the first sealing inorganic insulating film 26, and the second sealing inorganic insulating film 28 stacked on the first sealing inorganic insulating film 26.

The reverse-tapered bank structure portion 31 in a frame shape and the protruding portion 32 including four inorganic films 33 in a frame shape are formed on the base coat layer 3 so as to surround the opening 35. For example, in the example illustrated in FIG. 5, three reverse-tapered bank structure portions 31 and two protruding portions 32 are formed. The innermost reverse-tapered bank structure portion 31 and the second innermost reverse-tapered bank structure portion 31 are disposed on the base coat layer 3 with the protruding portion 32 on the inner side therebetween. The protruding portion 32 on the outer side is disposed outside the outermost reverse-tapered bank structure portion 31. The inorganic film 33 of the protruding portion 32 constitutes a crack prevention pattern.

A layered body of the first sealing inorganic insulating film 26 and the second sealing inorganic insulating film 28 is formed on the reverse-tapered bank structure portion 31. Further, a layered body of the first sealing inorganic insulating film 26 and the second sealing inorganic insulating film 28 is formed so as to cover the protruding portion 32. The layered body on the reverse-tapered bank structure portion 31 and the layered body that covers the protruding portion 32 are not contiguously formed, but are formed separately and stepped. The layered bodies on the reverse-tapered bank structure portions 31 adjacent to each other are also stepped.

As illustrated in FIG. 4(b), the first sealing inorganic insulating film 26 and the second sealing inorganic insulating film 28 formed with the organic film 27 therebetween extend to the position before the outermost reverse-tapered bank structure portion 31 from the display region DA side over a bank 23b.

Both side surfaces of the reverse-tapered bank structure portion 31 on the inner side and outer side are tilted in a reverse tapered shape whose width between both the side surfaces gradually decreases toward the resin substrate 12 side.

Each inorganic film 33 of the protruding portion 32 is a layered film including at least two or more layers of the base coat layer 3, the first interlayer insulating film 16, and the second interlayer insulating film 18 as inorganic insulating films, the first metal layer, the second metal layer, and the third metal layer as metal materials, and the semiconductor layer 15 as a semiconductor material. These inorganic films have acoustic capacities (inversely proportional to the product of the square of the speed of sound and the density) of substantially the same order, and transmission of crack from the inorganic film with a thin film thickness on the throughhole side can be prevented by providing the inorganic film with a thick film thickness on the display region side (having a larger number of inorganic film layers than the inorganic film with a thin film thickness). FIG. 6 illustrates an example in which the inorganic film 33 of the protruding portion 32 is composed of the base coat layer 3, the first interlayer insulating film 16 and the second interlayer insulating film 18, and this inorganic film 33 has a thicker film thickness than that of inorganic films (e.g., the base coat layer 3) in the vicinity of the inorganic film 33. The inorganic film 33 of the protruding portion 32 may further include any one of the first metal layer, the second metal layer, the third metal layer as metal materials, and the semiconductor layer 15.

Each reverse-tapered bank structure portion 31 may be composed of the same layer and material as those of the flattening film 21 of the thin film transistor layer 4, or may be composed of the edge cover 23 of the light-emitting element layer 5.

As illustrated in FIG. 6, each protruding portion 32 may be commonly covered with the flattening film 21 of the thin film transistor layer 4.

Preferably, the bank 23b that defines the edge of the organic film 27 of the sealing layer 6 is formed to surround the reverse-tapered bank structure portion 31 and the protruding portion 32.

The edge sealing portion 36 is composed of: the first sealing inorganic insulating film 26; and the second sealing inorganic insulating film 28 superimposed on the first sealing inorganic insulating film 26. Preferably, a film thickness T1 of the reverse-tapered bank structure portion 31 is thicker than a film thickness T2 of the sum of the film thickness of the first sealing inorganic insulating film 26 and the film thickness of the second sealing inorganic insulating film 28 of the edge sealing portion 36. The film thickness T2 of the sum of the film thickness of the first sealing inorganic insulating film 26 and the film thickness of the second sealing inorganic insulating film 28 is approximately 1.5 µm.

The first sealing inorganic insulating film 26 and the second sealing inorganic insulating film 28 are formed with the organic film 27 therebetween.

The width of the reverse-tapered bank structure portion 31 is approximately 20 µm. The MLC cutting capability in a cutting region R is approximately 117 µm (+58 µm, −59 µm). A dimension H from a worst position L2 of the cutting line outside a designed position L1 of the cutting line to a crack prevention pattern position L3 is approximately 113 µm.

A thickness dimension d1 of each inorganic film 33 of the protruding portion 32 is, for example, approximately 6 µm, and an interval d2 between the inorganic films 33 adjacent to each other is, for example, approximately 5 µm. A dimension d3 from the innermost inorganic film 33 to the lower end of the inner periphery wall of the protruding portion 32 is, for example, approximately 6 µm. A height dimension d4 of the flattening film 21 from the base coat layer 3 is, for example, approximately 2.5 µm. A height dimension d5 of each inorganic film 33 from the base coat layer 3 is approximately 1 µm. The base coat layer 3 includes $SiO_2$, and has a thickness of approximately 500 nm. Each resin layer 37 of the resin substrate 12 has a thickness of approximately 6 µm. An intermediate layer 38 of the resin substrate 12 has a thickness of approximately 500 nm. An adhesive layer 40 has a thickness of approximately 25 µm. The lower face film 10 includes polyethylene terephthalate (PET), and has a thickness of 75 μm. The resin layer 37 may be composed of, for example, PI (polyimide). The resin substrate 12 may be composed of only of the resin layer 37.

As described above, by providing both the reverse-tapered bank structure portion 31 and the inorganic film 33 of the protruding portion 32 (crack prevention pattern), the inorganic film 33 of the protruding portion 32 prevents advancement of a crack C1 advancing in the base coat layer 3 from the first sealing inorganic insulating film 26 and the second sealing inorganic insulating film 28 of the edge sealing portion 36, and the reverse-tapered bank structure portion 31 prevents advancement of a crack C2 advancing in the surface layer of the sealing layer 6 from the first sealing inorganic insulating film 26 and the second sealing inorganic insulating film 28 of the edge sealing portion 36.

The crack that occurs when processing the hole portion 34 includes the crack C1 that advances in the base coat layer 3 from the first sealing inorganic insulating film 26 and the second sealing inorganic insulating film 28; and the crack C2 that advances in the surface layer of the sealing layer 6 from the first sealing inorganic insulating film 26 and the second sealing inorganic insulating film 28. For the crack C1 that advances in the base coat layer 3, the advancement to the display region DA is prevented by the step of the inorganic film 33. For the crack C2 that advances in the surface layer of the sealing layer 6, the advancement to the display region DA is prevented by: both the side surfaces of the reverse-tapered bank structure portion 31 being tilted in a reverse tapered shape whose width between both the side surfaces gradually decreases toward the resin substrate 12 side; and the reverse-tapered bank structure portion 31 being formed separately from the edge sealing portion 36. Thus, the advancement of crack in both the surface layer and interior of the sealing layer 6 can be prevented.

In addition, with the above-mentioned configuration, it is not necessary to preliminarily remove the first sealing inorganic insulating film 26 and the second sealing inorganic insulating film 28 of the hole portion 34 that forms a hole, and thus the steps can be reduced.

Second Embodiment

Figure 7:
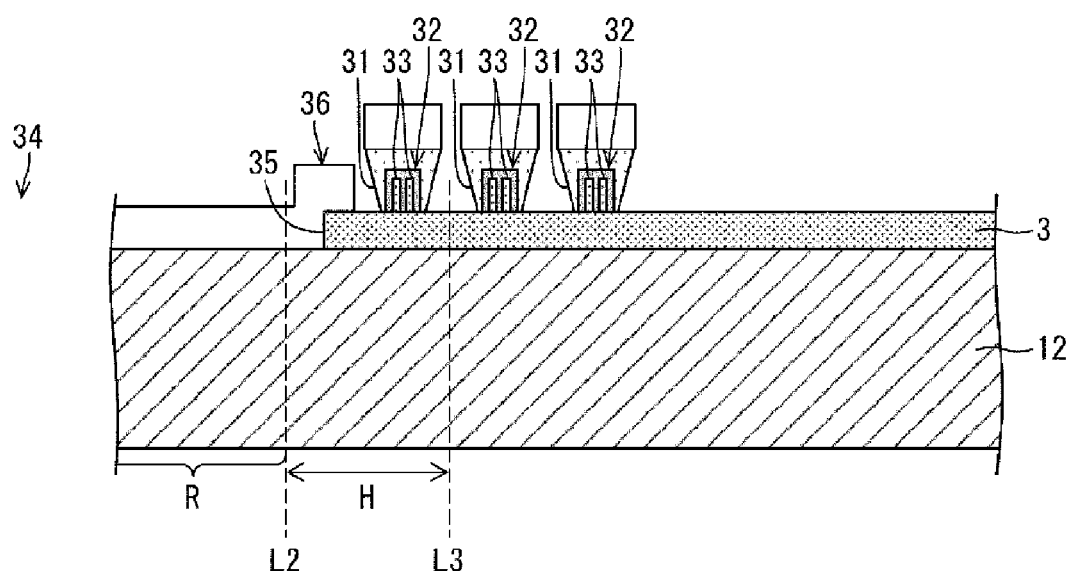
FIG. 7 is an enlarged cross-sectional view for describing a reverse-tapered bank structure portion and a protruding portion of a non-display region of a display device according to a second embodiment.

FIG. 7 is an enlarged cross-sectional view for describing the reverse-tapered bank structure portion 31 and the protruding portion 32 of the non-display region XA of a display device according to a second embodiment. The same constituent elements as the above-described constituent elements are denoted with the same reference numerals, and detailed descriptions of such constituent elements are not repeated.

As illustrated in FIG. 7, a difference from the above-described in the first embodiment is that the reverse-tapered bank structure portion 31 and the protruding portion 32 are disposed in a superimposed manner and that the protruding portion 32 is formed inside the reverse-tapered bank structure portion 31.

In the case where there is the edge sealing portion 36 where the first sealing inorganic insulating film 26 and the base coat layer 3 are in contact, it is necessary to leave the crack prevention pattern (the inorganic film 33 of the protruding portion 32) to prevent advancement of the crack that propagates in the base coat layer 3 from the first sealing inorganic insulating film 26.

In view of this, when the reverse-tapered bank structure portion 31 is disposed at least at one portion for each of before and after the crack prevention pattern, the frame region of the hole portion 34 increases by 40 μm on the assumption that L/S is 20 μm. In this manner, when a crack prevention pattern is independently provided, it is necessary to increase the frame region in the vicinity of the hole portion 34 by the amount corresponding to the crack prevention pattern, and thus the display region DA is reduced by the amount of the crack prevention pattern.

Conversely, in the second embodiment, the reverse-tapered bank structure portion 31 and the protruding portion 32 are disposed in a superimposed manner, and the protruding portion 32 is formed inside the reverse-tapered bank structure portion 31. Thus, the frame region in the vicinity of the hole portion 34 can be reduced, and the display region DA can be enlarged.

Further, with the crack prevention pattern provided inside the reverse-tapered bank structure portion 31, the advancement of cracks can be efficiently prevented in comparison with the case where the crack prevention pattern is individually provided outside the reverse-tapered bank structure portion 31.

Supplement

A display device of a first aspect is a display device including: a resin substrate; a thin film transistor layer including a plurality of inorganic insulating films; a light-emitting element; and a sealing layer including a sealing inorganic insulating film, the resin substrate, the thin film transistor layer, the light-emitting element, and the sealing layer being layered in this order. The light-emitting element includes a first electrode, a second electrode, and a function layer disposed between the first electrode and the second electrode, the display device includes a display region, a frame region that surrounds the display region, and a non-display region provided in the display region in an island form, the display device includes a hole portion provided in the non-display region, a first opening that surrounds the hole portion is formed in at least one inorganic insulating film in the plurality of inorganic insulating films of the non-display region, the sealing inorganic insulating film includes an edge sealing portion in a frame shape, the edge sealing portion being formed so as to cover an edge of the at least one inorganic insulating film around the hole portion, a reverse-tapered bank structure portion in a frame shape and a protruding portion including an inorganic film in a frame shape are formed to surround the first opening on the at least one inorganic insulating film, and both side surfaces of the reverse-tapered bank structure portion are tilted in a reverse tapered shape whose width between both the side surfaces gradually decreases toward a side of the resin substrate.

In the display device of a second aspect, two of the reverse-tapered bank structure portions are disposed on the at least one inorganic insulating film, with the protruding portion between the two reverse-tapered bank structure portions.

In the display device of a third aspect, the reverse-tapered bank structure portion and the protruding portion are disposed in a superimposed manner, and the protruding portion is formed inside the reverse-tapered bank structure portion.

In the display device of a fourth aspect, at least one of the plurality of inorganic insulating films includes a base coat layer, and in the base coat layer, a second opening configured to expose the resin substrate is formed to surround the hole portion.

In the display device of a fifth aspect, the inorganic film of the protruding portion is composed of the plurality of inorganic insulating films.

In the display device of a sixth aspect, the thin film transistor layer further includes a metal layer, and the inorganic film of the protruding portion is composed of the metal layer.

In the display device of a seventh aspect, the thin film transistor layer further includes a semiconductor layer, and the inorganic film of the protruding portion is composed of the semiconductor layer.

In the display device of an eighth aspect, the thin film transistor layer further includes a flattening film, and the reverse-tapered bank structure portion is composed of a layer identical to that of the flattening film and a material identical to that of the flattening film.

In the display device of a ninth aspect, the reverse-tapered bank structure portion is composed of an edge cover.

In the display device of a tenth aspect, the thin film transistor layer further includes a flattening film, and the protruding portion is covered with the flattening film.

In the display device of an eleventh aspect, a plurality of the protruding portions are formed, and the plurality of protruding portions are commonly covered with the flattening film.

In the display device of a twelfth aspect, the sealing layer further includes an organic film, and a bank that defines an edge of the organic film is formed to surround the reverse-tapered bank structure portion and the protruding portion.

In the display device of a thirteenth aspect, the sealing inorganic insulating film includes a first sealing inorganic insulating film and a second sealing inorganic insulating film, and the edge sealing portion is composed of the first sealing inorganic insulating film and the second sealing inorganic insulating film superimposed on the first sealing inorganic insulating film.

In the display device of a fourteenth aspect, a film thickness of the reverse-tapered bank structure portion is thicker than a film thickness of a sum of a film thickness of the first sealing inorganic insulating film of the edge sealing portion and a film thickness of the second sealing inorganic insulating film of the edge sealing portion.

In the display device of a fifteenth aspect, the sealing inorganic insulating film includes a first sealing inorganic insulating film and a second sealing inorganic insulating film, the sealing layer further includes an organic film, and the first sealing inorganic insulating film and the second sealing inorganic insulating film are formed with the organic film between the first sealing inorganic insulating film and the second sealing inorganic insulating film.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A display device comprising:
   a resin substrate;
   a thin film transistor layer including a plurality of inorganic insulating films;
   a light-emitting element; and
   a sealing layer including a sealing inorganic insulating film,
   the resin substrate, the thin film transistor layer, the light-emitting element, and the sealing layer being layered in this order,
   wherein the light-emitting element includes a first electrode, a second electrode, and a function layer disposed between the first electrode and the second electrode,
   the display device includes a display region, a frame region that surrounds the display region, and a non-display region provided in the display region in an island form,
   the display device includes a hole portion provided in the non-display region,
   a first opening that surrounds the hole portion is formed in at least one inorganic insulating film in the plurality of inorganic insulating films of the non-display region,
   the sealing inorganic insulating film includes an edge sealing portion in a frame shape, the edge sealing portion being formed so as to cover an edge of the at least one inorganic insulating film around the hole portion,
   a reverse-tapered bank structure portion in a frame shape and a protruding portion including an inorganic film in a frame shape are formed to surround the first opening on the at least one inorganic insulating film,
   both side surfaces of the reverse-tapered bank structure portion are tilted in a reverse tapered shape whose width between both the side surfaces gradually decreases toward a side of the resin substrate,
   the thin film transistor layer further includes a semiconductor layer, and
   the inorganic film of the protruding portion is composed of the semiconductor layer.

2. The display device according to claim 1,
   wherein two of the reverse-tapered bank structure portions are disposed on the at least one inorganic insulating film, with the protruding portion between the two reverse-tapered bank structure portions.

3. The display device according to claim 1,
   wherein the reverse-tapered bank structure portion and the protruding portion are disposed in a superimposed manner, and
   the protruding portion is formed inside the reverse-tapered bank structure portion.

4. The display device according to claim 1,
   wherein at least one of the plurality of inorganic insulating films includes a base coat layer, and
   in the base coat layer, a second opening configured to expose the resin substrate is formed to surround the hole portion.

5. The display device according to claim 1,
   wherein the inorganic film of the protruding portion is composed of the plurality of inorganic insulating films.

6. The display device according to claim 1,
   wherein the thin film transistor layer further includes a metal layer, and
   the inorganic film of the protruding portion is composed of the metal layer.

7. The display device according to claim 1,
   wherein the thin film transistor layer further includes a flattening film, and
   the reverse-tapered bank structure portion is composed of a layer identical to that of the flattening film and a material identical to that of the flattening film.

8. The display device according to claim 1,
   wherein the reverse-tapered bank structure portion is composed of an edge cover.

9. The display device according to claim 1,
   wherein the thin film transistor layer further includes a flattening film, and
   the protruding portion is covered with the flattening film.

10. The display device according to claim 9,
wherein a plurality of the protruding portions are formed, and the plurality of protruding portions are commonly covered with the flattening film.

11. The display device according to claim 1,
wherein the sealing layer further includes an organic film, and a bank that defines an edge of the organic film is formed to surround the reverse-tapered bank structure portion and the protruding portion.

12. The display device according to claim 1,
wherein the sealing inorganic insulating film includes a first sealing inorganic insulating film and a second sealing inorganic insulating film, and the edge sealing portion is composed of the first sealing inorganic insulating film and the second sealing inorganic insulating film superimposed on the first sealing inorganic insulating film.

13. The display device according to claim 12,
wherein a film thickness of the reverse-tapered bank structure portion is thicker than a film thickness of a sum of a film thickness of the first sealing inorganic insulating film of the edge sealing portion and a film thickness of the second sealing inorganic insulating film of the edge sealing portion.

14. The display device according to claim 1,
wherein the sealing inorganic insulating film includes a first sealing inorganic insulating film and a second sealing inorganic insulating film, the sealing layer further includes an organic film, and the first sealing inorganic insulating film and the second sealing inorganic insulating film are formed with the organic film between the first sealing inorganic insulating film and the second sealing inorganic insulating film.

* * * * *